United States Patent
An et al.

(10) Patent No.: US 7,826,563 B2
(45) Date of Patent: Nov. 2, 2010

(54) HIGH SPEED MULTI-MODULUS PRESCALAR DIVIDER

(75) Inventors: Hongming An, San Diego, CA (US); Simon Pang, San Diego, CA (US); Viet Linh Do, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 893 days.

(21) Appl. No.: 11/717,262

(22) Filed: Mar. 13, 2007

(65) Prior Publication Data

US 2008/0225989 A1 Sep. 18, 2008

(51) Int. Cl.
*H03D 3/24* (2006.01)

(52) U.S. Cl. .................. 375/327; 375/219; 375/221; 375/294; 375/302; 375/376; 455/67.13; 455/276.1; 331/2; 331/16

(58) Field of Classification Search .......... 375/211, 375/215, 219, 259, 286, 294, 316, 322, 327, 375/340, 347, 354, 359, 297, 299, 306, 342, 375/343, 371, 376; 331/1, 16, 34, 74, 115, 331/156

See application file for complete search history.

(56) References Cited

U.S. PATENT DOCUMENTS

| | | | | |
|---|---|---|---|---|
| 5,227,881 A | * | 7/1993 | Wess et al. | 348/512 |
| 7,467,317 B2 | * | 12/2008 | Matsui | 713/401 |
| 7,647,026 B2 | * | 1/2010 | Darabi | 455/67.13 |
| 2004/0232995 A1 | * | 11/2004 | Thomsen et al. | 331/2 |
| 2005/0227660 A1 | * | 10/2005 | Hashemi et al. | 455/276.1 |
| 2006/0071717 A1 | * | 4/2006 | El-Kacimi et al. | 331/16 |
| 2006/0222134 A1 | * | 10/2006 | Eldredge et al. | 375/371 |
| 2007/0233903 A1 | * | 10/2007 | Pyeon | 710/1 |
| 2008/0024240 A1 | * | 1/2008 | Wang | 332/127 |
| 2008/0164917 A1 | * | 7/2008 | Floyd et al. | 327/117 |

* cited by examiner

*Primary Examiner*—Shuwang Liu
*Assistant Examiner*—Hirdepal Singh
(74) *Attorney, Agent, or Firm*—Law Office of Gerald Maliszewski; Gerald Maliszewski

(57) ABSTRACT

A system and method are provided for multi-modulus division. The method accepts an input first signal having a first frequency and divides the first frequency by an integral number. A second signal is generated with a plurality of phase outputs, each having a second frequency. Using a daisy-chain register controller, phase outputs are selected and supplied as a third signal with a frequency. Selecting phase outputs using the daisy-chain register controller includes supplying the third signal as a clock signal to registers having outputs connected in a daisy-chain. Then, a sequence of register output pulses is generated in response to the clock signals, and register output pulses are chosen from the sequence to select second signal phase outputs. By using 8-second signal phase outputs, a third signal is obtained with a frequency equal to the second frequency multiplied by one of the following numbers: 0.75, 0.875, 1, 1.125, or 1.25.

16 Claims, 13 Drawing Sheets

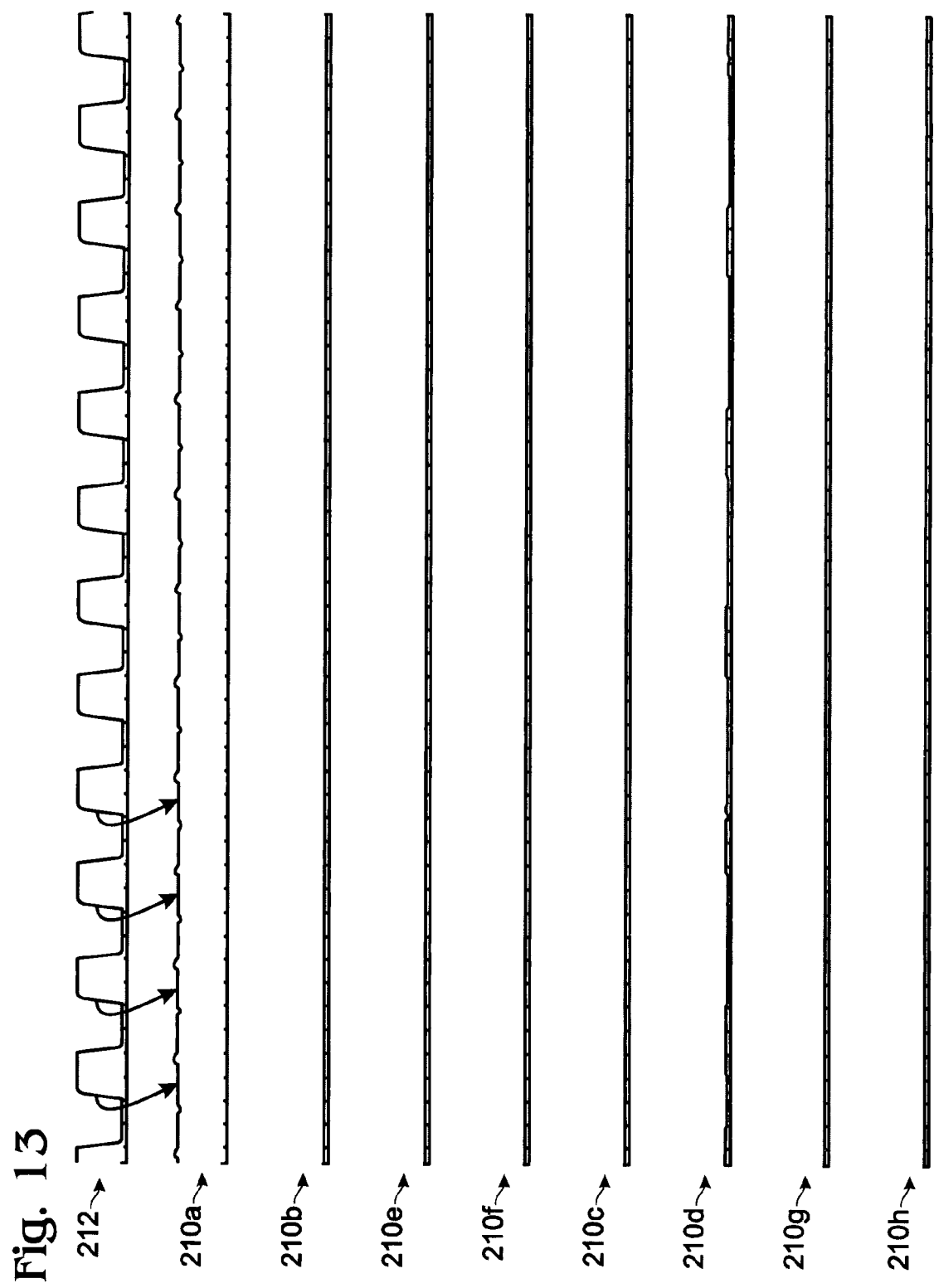

HIGH SPEED MULTI-MODULUS PRESCALAR DIVIDER

BACKGROUND OF THE INVENTION

1. Field of the Invention

This invention generally relates to electronic circuitry and, more particularly, to a system and method for multi-modulus prescalar division.

2. Description of the Related Art

FIG. 1 is a schematic block diagram of a conventional phase locked loop (prior art). A phase detector (or frequency detector) receives a first input signal, such as might be supplied on a serial data stream or a clock source, and compares it to a second input signal supplied by the divider. The phase detector (PD) generates an output that is responsive to difference in timing between the two input signals. A charge-pump may be added to improve the response of the PLL, as the phase detector output does not necessarily have enough drive to instantaneously charge (or discharge) the loop filter reactances. The loop filter is typically a low-pass filter, and is used to control the overall loop response. The voltage controlled oscillator (VCO) supplies an output frequency that is responsive to the input voltage level. The loop is locked when the phase detector inputs match. The divider is typically inserted in the path between the VCO and the phase detector. The divider has two primary functions. The divider permits the phase detector to be operated at a lower frequency. Also, the divider acts as a relatively simple means of controlling the VCO output frequency.

The VCO can be controlled to supply a number of different frequencies by manipulating the division ratio. This task is relatively simple if the divider is a hardware device designed to divide the VCO frequency by a range of selectable integer numbers. "Pulse-swallowing" is one technique that can be used to obtain a desired division ratio. Pulse-swallowing also permits non-integer and odd-inter ratios to be obtained. For example, a divisor of 3 may be obtained if the VCO frequency is alternately divided by the divisors of 2 and 4. However, the pulse-swallowing technique may generate undesirable harmonic frequencies components. Further, it may not be possible to conveniently generate every required frequency using just the pulse-swallowing technique.

It would be advantageous if a divider existed that was able to divide an input frequency with a range of selectable odd-integer and non-integer values.

SUMMARY OF THE INVENTION

The multi-modulus divider is presented that divides a signal using division ratios such as 0.75, 0.875, 1, 1.125, and 1.25, dynamically in response to a control signal, by selecting between different phases of a reference frequency. The divider is able to divide high speed input signals, without glitches while consuming low amounts of power. Therefore, the circuitry has application as a high performance prescalar in fractional-N synthesizers, especially in fractional-N synthesizers with high loop frequencies where low dividing ratios are required.

Accordingly, a method is provided for multi-modulus division. The method accepts an input first signal having a first frequency and divides the first frequency by an integral number. As a result, a second signal is generated with a plurality of phase outputs, each having a second frequency. Using a daisy-chain register controller, phase outputs are selected and supplied as a third signal with a frequency. In one aspect, a second signal is generated with a first number of equally-spaced phase outputs. For example, 8 phase outputs may be generated every 45°, from 0° to 315°.

In another aspect, selecting phase outputs using the daisy-chain register controller includes supplying the third signal as a clock signal to registers having outputs connected in a daisy-chain. Then, a sequence of register output pulses is generated in response to the clock signals, and the sequence of register output pulses is used to select second signal phase outputs. By using 8 second signal phase outputs, a third signal is obtained with a frequency equal to the second frequency multiplied by one of the following numbers: 0.75, 0.875, 1, 1.125, or 1.25. If the second signal has a frequency equal to the first frequency divided by four, then the overall divisor can be 3, 3.5, 4, 4.5, or 5.

Additional details of the above-described method and a multi-modulus division system are provided below.

BRIEF DESCRIPTION OF THE DRAWINGS

FIG. 13 is a timing diagram depicting the sequence of MUX register outputs that are selected in order to obtain the 1 division ratio, with respect to the second frequency.

DETAILED DESCRIPTION

Figure 1:
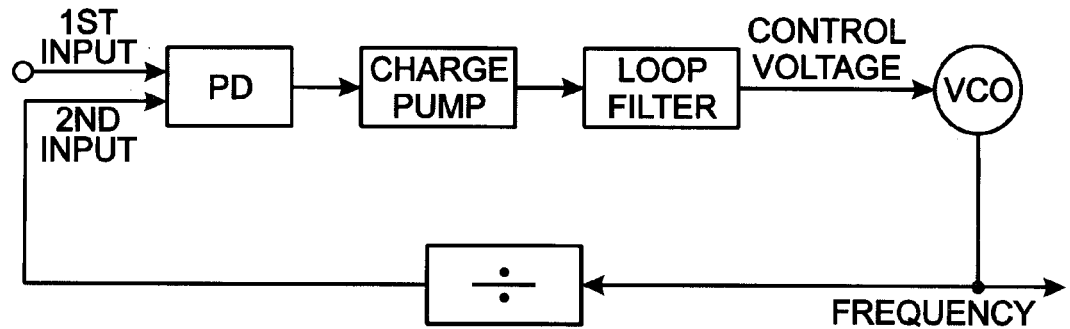
FIG. 1 is a schematic block diagram of a conventional phase locked loop (prior art).
Figure 2:
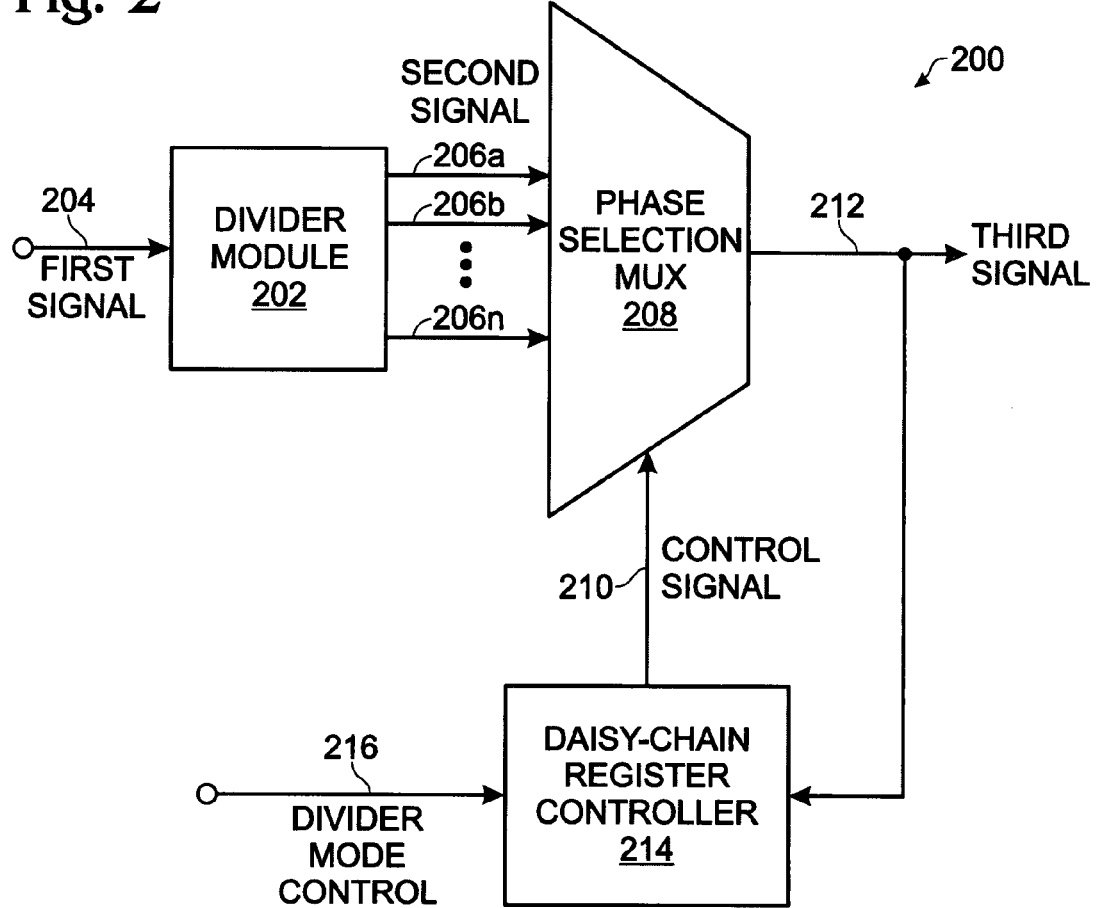
FIG. 2 is a schematic block diagram of a system for multi-modulus division.

FIG. 2 is a schematic block diagram of a system for multi-modulus division. The system 200 comprises a divider module 202 having an input on line 204 to accept a first signal having a first frequency. Referencing FIG. 1 briefly, line 204 may be a VCO output for example. The divider module 202 divides the first frequency by an integral number and supplies a second signal with a plurality of phase outputs on line 206, each having a second frequency. Phase output lines 206a through 206n are shown, where n is not limited to any particular number.

A phase selection multiplexer (MUX) 208 has an input on lines 206 to accept the plurality of second signal phase outputs, and an input on line 210 to accept a control signal. The phase selection multiplexer 208 has an output on line 212 to supply a second signal phase selected in response to the control signal on line 210. A daisy-chain register controller 214 has an output on line 210 to supply the control signal for dynamically selecting the second signal phase outputs, in response to a digital divider mode control signal on line 216. In this manner, the phase selection multiplexer 208 supplies the selected phase outputs as a third signal with a frequency on line 212. It should be noted that although the signals are presented as single-ended signals referenced to dc or ground voltage for simplicity, in other aspects (not shown) the system may be enabled with differential signals.

Figure 3:
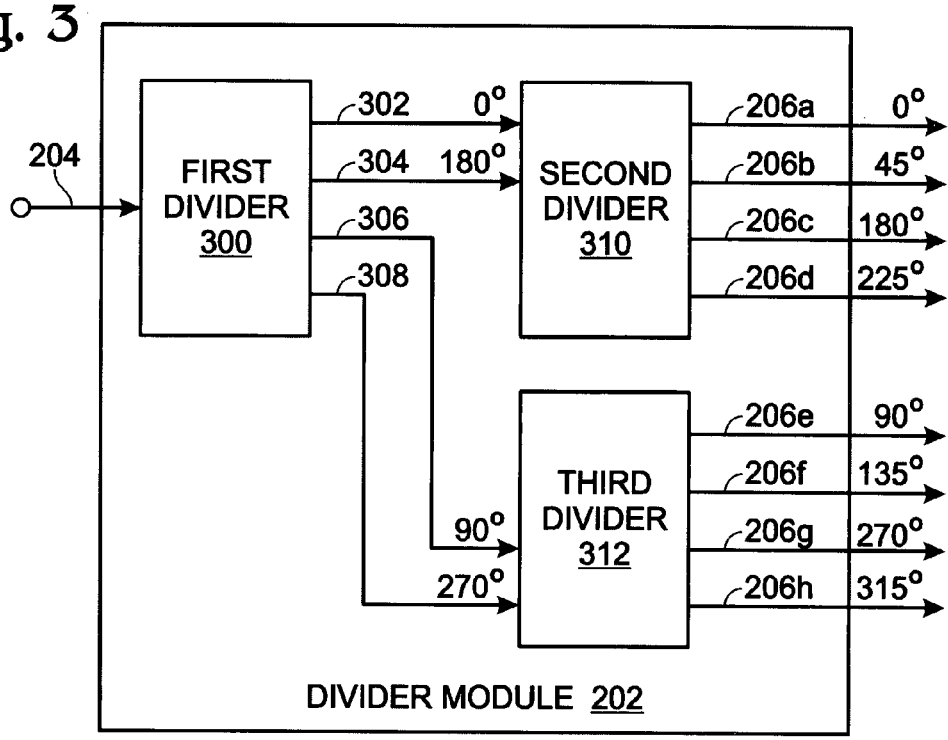
FIG. 3 is a schematic block diagram of an exemplary divider module of FIG. 2 in greater detail.

FIG. 3 is a schematic block diagram of an exemplary divider module of FIG. 2 in greater detail. Typically, the divider module 202 generates a second signal with a first number of equally-spaced phase outputs. In this example, 8-equally spaced (45° offset) phases are created. A first divider 300 accepts the input signal on line 204 and divides the signal by an even-integer value. In this example, the integer value is 2. A 0° phase offset signal is supplied on line 302, and a 180° phase offset signal is supplied on line 304. Note: the phase is defined with respect to the leading edge of the input signal on line 204. Also note: in this example, the signals on lines 302 and 304 are differential signals. A 90° phase offset signal is supplied on line 306, and a 270° phase offset signal is supplied on line 308.

A second divider 310 accepts the input signal on lines 302 and 304 and divides the signal by an even-integer value (e.g., 2). 0°, 45°, 180°, and 225° phase offset signals are supplied on lines 206a through 206d. A third divider 312 accepts the input signal on lines 306 and 308 and divides the signal by an even-integer value (e.g., 2). 90°, 135°, 270°, and 315° phase offset signals are supplied on lines 206e through 206h. Although this example shows a division of the input signal by 4, with 8 phase offsets, it should be understood that the system is not limited to any particular division ratio or any particular number of phase outputs.

Figure 4:
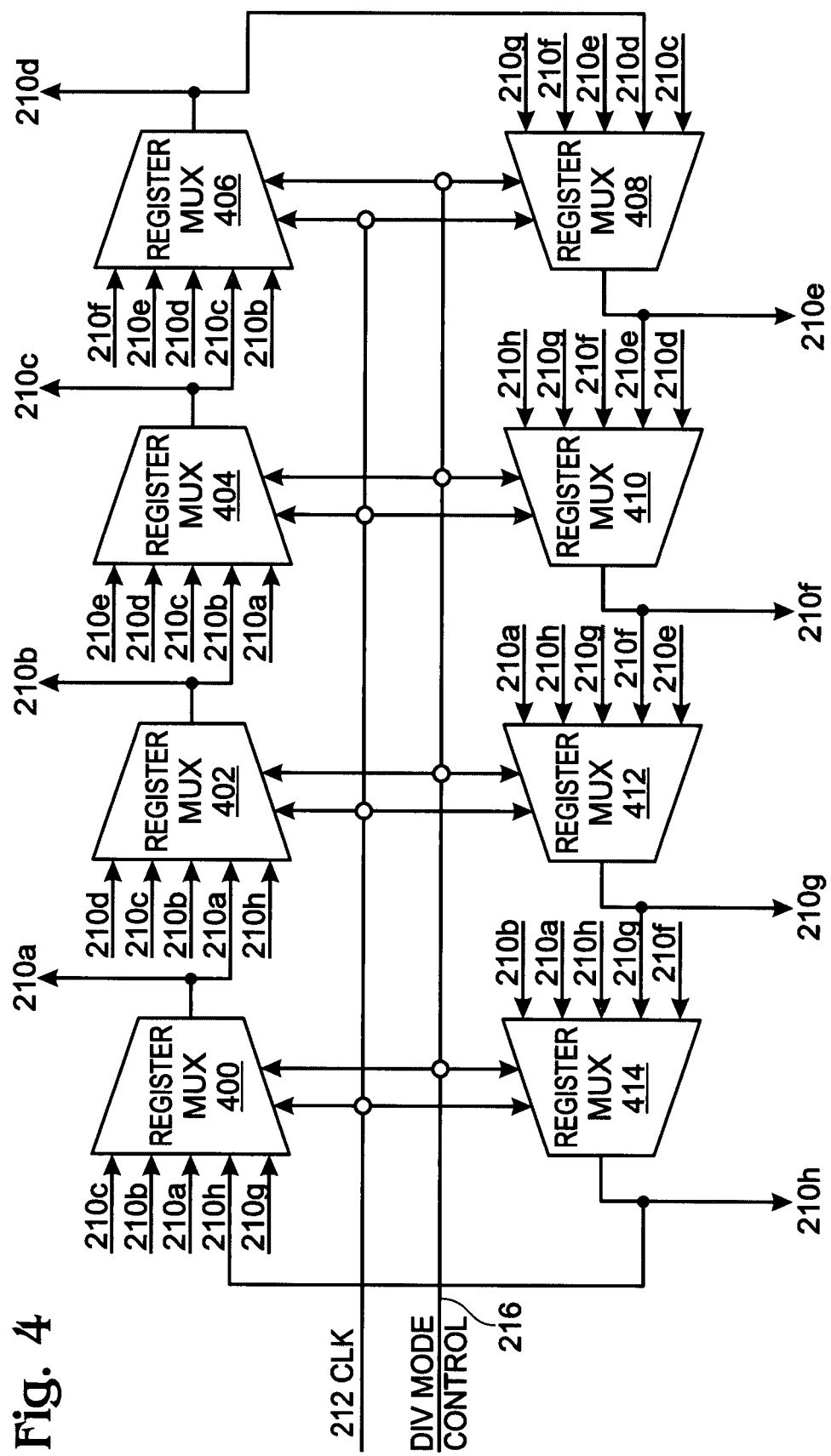
FIG. 4 is a schematic block diagram of an exemplary daisy-chain register controller of FIG. 2 in greater detail.

FIG. 4 is a schematic block diagram of an exemplary daisy-chain register controller of FIG. 2 in greater detail. The daisy-chain register controller 214 includes a plurality of registers with daisy-chain-connected outputs. Here, eight MUX registers 400 through 414 are shown. The MUX registers in this example have a 5 inputs and one output. The MUX selection is controlled by the 3-bit dividing mode control signal. The dividing mode can be changed dynamically. The use of eight MUX registers corresponds with the use of eight phase outputs (see FIG. 3). Although the exemplary daisy-chain controller is intended to continue the example started in FIG. 3, it should be understood that the controller 214 is not necessarily limited to eight registers. Typically, the number of MUX registers in the controller 214 matches the number of second signal phase outputs. The daisy-chain controller accepts the third signal on line as the register clock signal, and generates a sequence of register output pulses in response to the clock signals. That is, each MUX register generates an output pulse in response to the combination of the clock pulse and the output pulses from other MUX registers in the chain of registers.

At each clock cycle, only one of the MUX registers gets a high (or low) output pulse from all the MUX registers inputs. Depending on the mode control signal, the high pulse remains at same register output (divide by 4 mode), or is shifted clockwise to next register output (divide by 3.5 mode), or is shifted clockwise to next alternate register output (divide by 3 mode), or is shifted anti-clockwise to next register output (divide by 4.5 mode), or is shifted anti-clockwise to next alternate register (divide by 5 mode), at the next clock. The controller 214 generates a sequence of MUX register output pulses for use as the control signal supplied to the phase selection multiplexer on line 210. The sequence of MUX register output pulses is generated in response to a 3-bit control signal received on line 216.

Considering FIGS. 2, 3, and 4, the phase selection MUX 208 performs the phase selection of outputs 202 in accordance with the control signals on line 210. In one aspect, the phase selection MUX 208 generates a signal on line 212 using the following logic function:

$$212=206a*210a+206b*210b+206c*210c+206d*210d+206e*210e+206f*210f+206g*210g+206h*210h.$$

There are many circuit topologies that could be used to implement this function. For high speed dividing applications, the delay of the phase selection MUX 208 should be controlled and minimized. In this regards, a small number of symmetrical delay stages are preferred.

Figure 5:
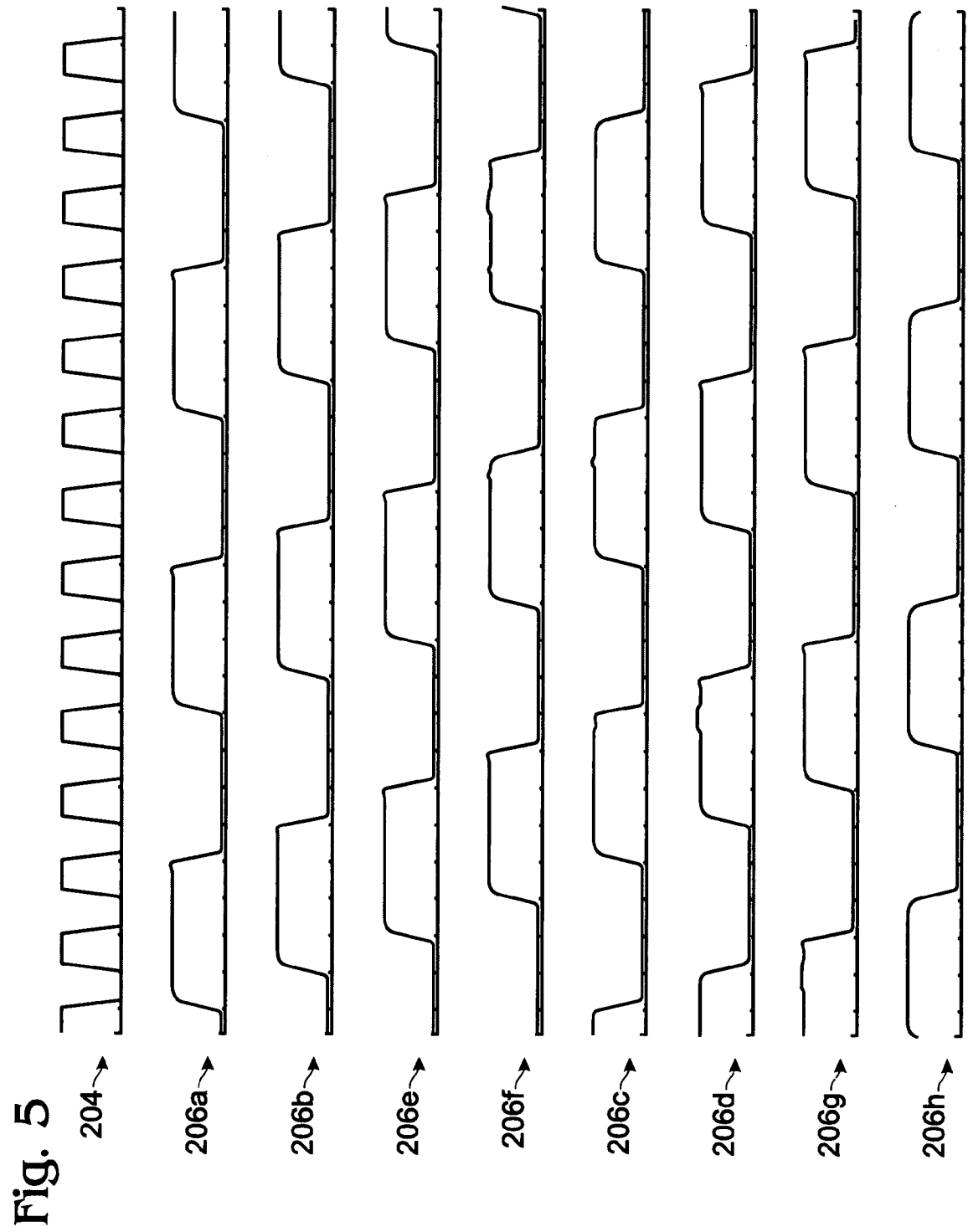
FIG. 5 is a timing diagram contrasting the first signal and second signal phase outputs.

FIG. 5 is a timing diagram contrasting the first signal 204 and second signal phase outputs 206a-206h. As shown, the divider module generates 8 phases with an equal phase delay of 45 degrees from neighboring pulses. This diagram assumes that the second frequency (the frequency of the second signal) is one-fourth the first frequency (the frequency of the first signal).

Figure 6:
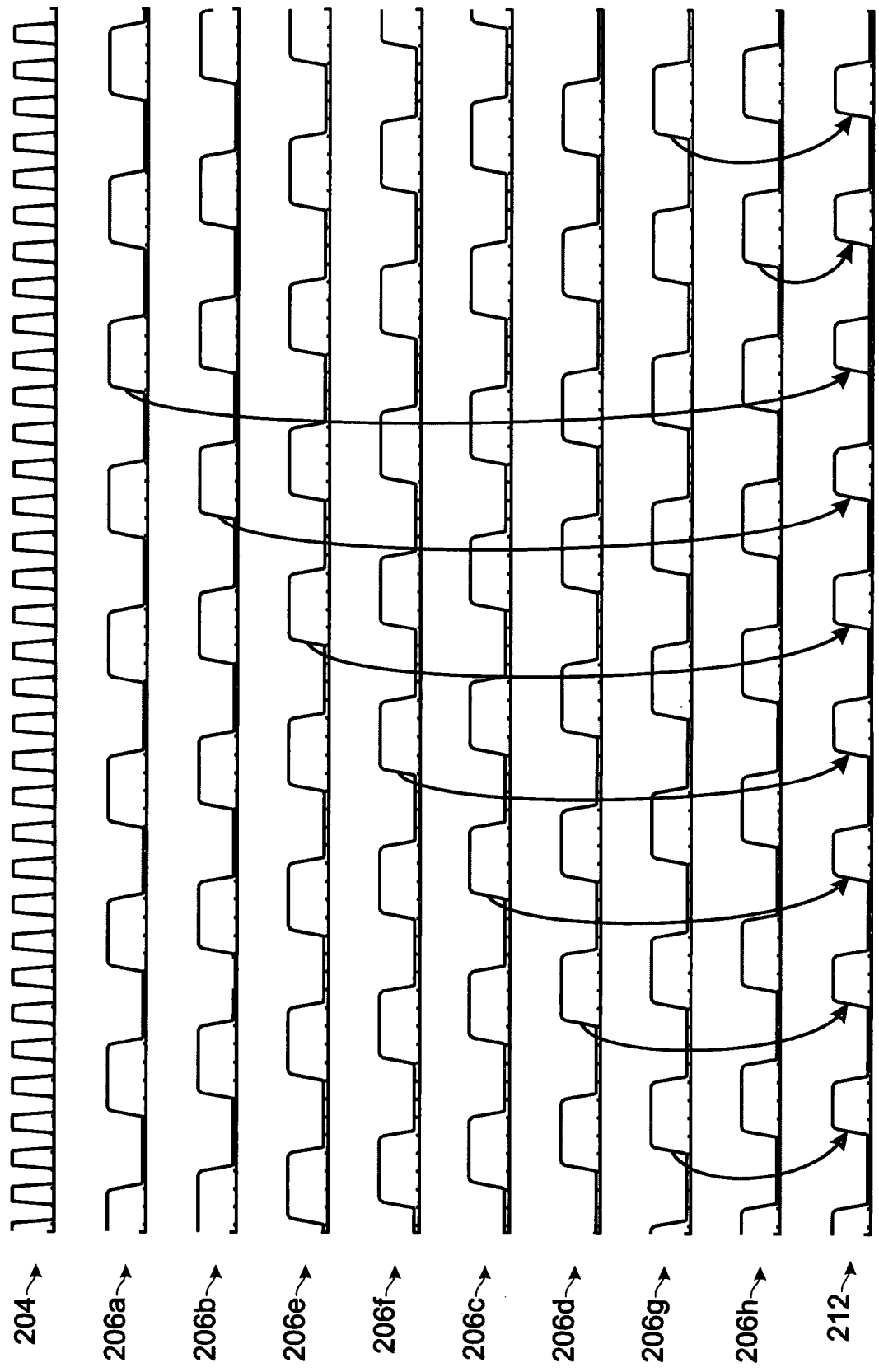
FIG. 6 is a timing diagram depicting the order of second signal phase outputs that must be selected to obtain a division ratio of 3.5, with respect to the first frequency.

FIG. 6 is a timing diagram depicting the order of second signal phase outputs that must be selected to obtain a division ratio of 3.5, with respect to the first frequency. Alternately stated, the third frequency is equal the second frequency multiplied by 0.875. As shown, the rising edge of a different phase is selected each clock cycle. Generally, the daisy-chain register controller generates a second pattern of register output pulses (FIG. 7), and the phase selection multiplexer supplies phase outputs having a second period, different from the first period, which is the period associated with the second signal, as a third signal with a third signal frequency 212, different from the second frequency. More explicitly, the phase selection multiplexer supplies phase outputs having a second period, less than the first period, creating a third signal frequency, higher than the second frequency. Alternately considered, the phase selection multiplexer supplies phase outputs having a second period, different from the first period, creating a third signal frequency that is a non-integer or odd-integer quotient of the second frequency.

Figure 7:
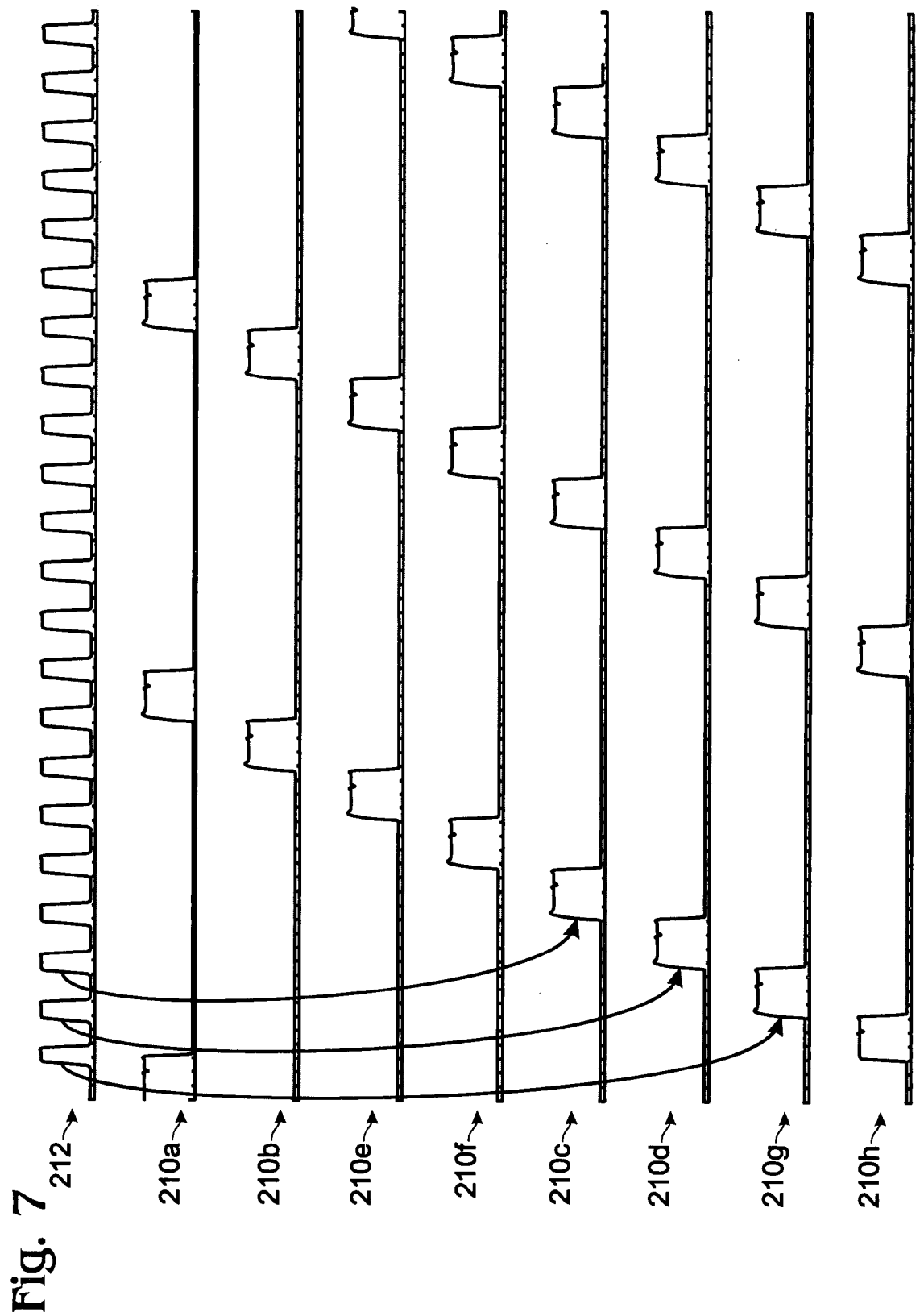
FIG. 7 is a timing diagram depicting the sequence of MUX register outputs that are selected in order to obtain the 3.5 division ratio of FIG. 6.

FIG. 7 is a timing diagram depicting the sequence of MUX register outputs that are selected in order to obtain the 3.5 division ratio of FIG. 6. As shown, the daisy-chain register controller has only one pulse high per clock cycle, and shifts to next register output clockwise in the next clock. One MUX register pulse selects the corresponding phase signal of 206, and then the next phase signal 206 is selected by the next MUX register output. The phase signal 206 chosen by next MUX register output pulse is 45 degree advanced, as compared to the previous selected signal. A dividing ratio of 0.875 is achieved, with respect to the second signal.

Figure 8:
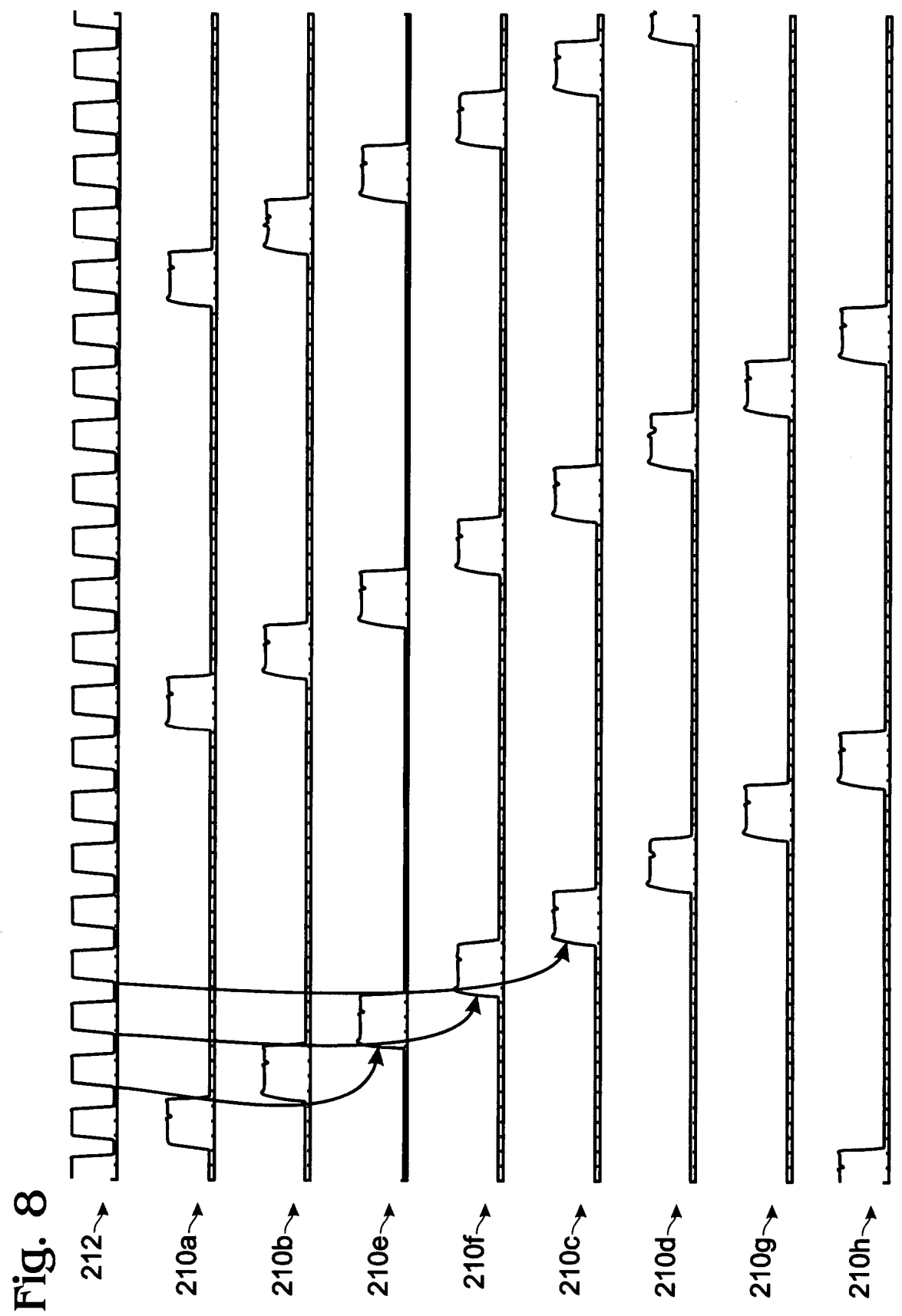
FIG. 8 is a timing diagram depicting the sequence of MUX register outputs that are selected to obtain a division ratio of 4.5, with respect to the first frequency.

FIG. 8 is a timing diagram depicting the sequence of MUX register outputs that are selected to obtain a division ratio of 4.5, with respect to the first frequency. Alternately stated, the third signal frequency (third frequency) is equal the second frequency multiplied by 1.125. Again the daisy-chain register controller has only one pulse high per clock cycle, and shifts to next register output anti-clockwise in the next clock cycle. A phase signal 206 is chosen by a MUX register output pulse that has a 45 degree delay, as compared to the previous selected signal. The phase selection multiplexer supplies phase outputs having a second period, greater than the first period, creating a third signal frequency, lower than the second frequency.

Figure 9:
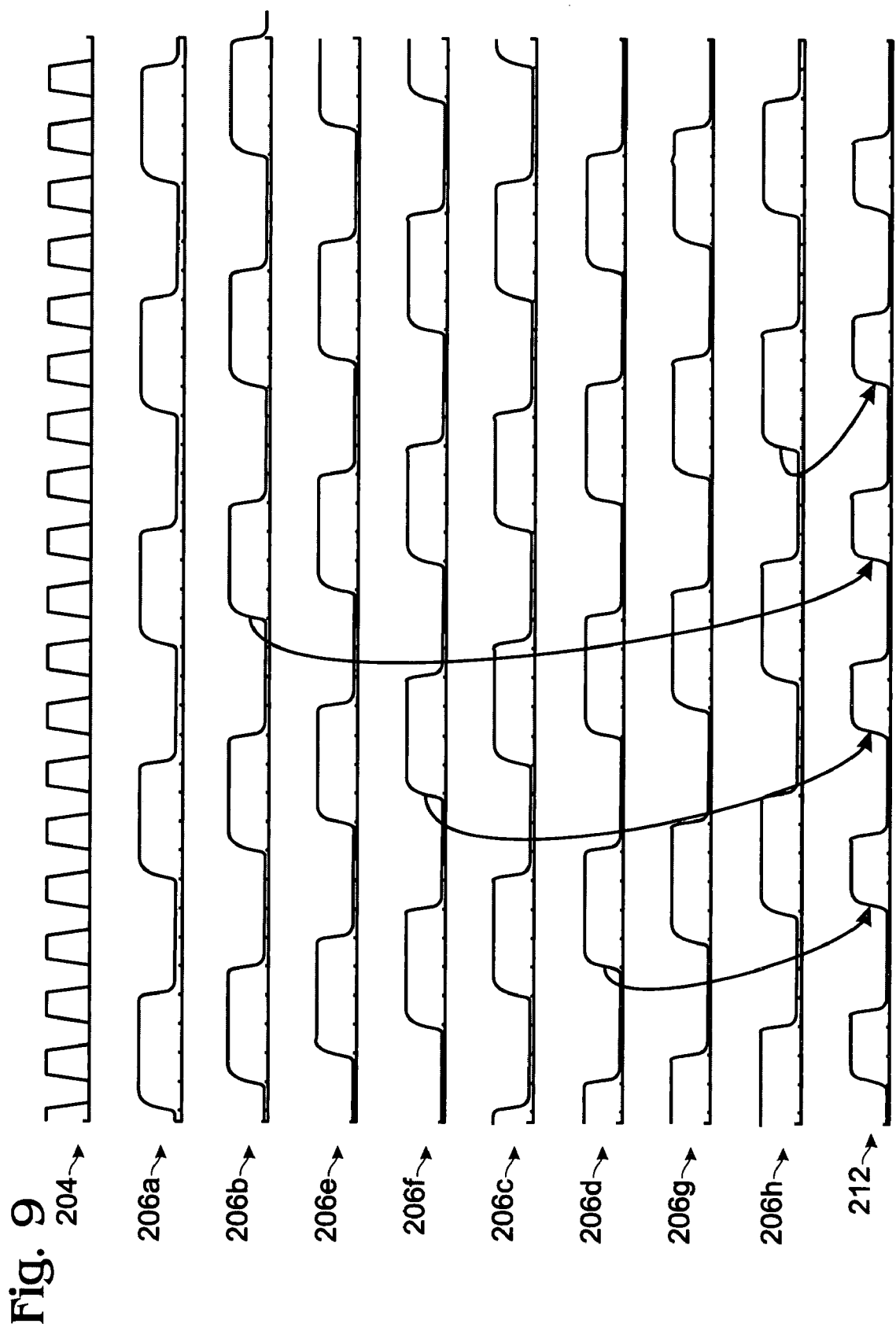
FIG. 9 is a timing diagram depicting the sequence of second signal phase outputs that are selected in order to obtain the division ratio of 3, with respect to the first frequency.

FIG. 9 is a timing diagram depicting the sequence of second signal phase outputs that are selected in order to obtain the division ratio of 3, with respect to the first frequency. As shown, 4 out of the 8 output signal rise edges are selected. The third signal frequency is equal the second frequency multiplied by 0.75.

Figure 10:
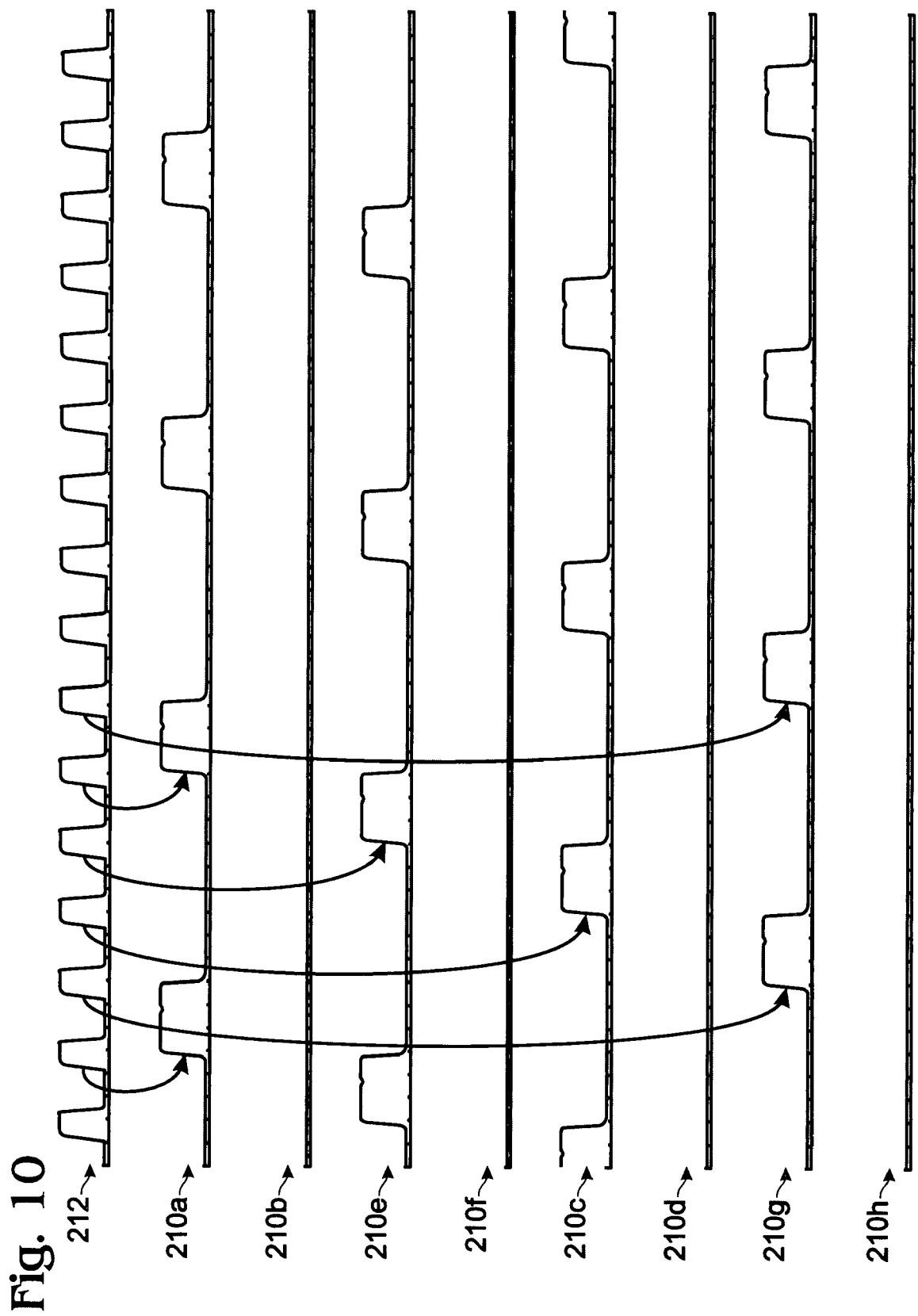
FIG. 10 is a timing diagram depicting the sequence of MUX register outputs that are selected in order to obtain the 3 division ratio of FIG. 9.

FIG. 10 is a timing diagram depicting the sequence of MUX register outputs that are selected in order to obtain the 3 division ratio of FIG. 9. The phase signal of 206 chosen by MUX register output pulses that are advanced 90 degrees with respect to the previously selected signal.

Figure 11:
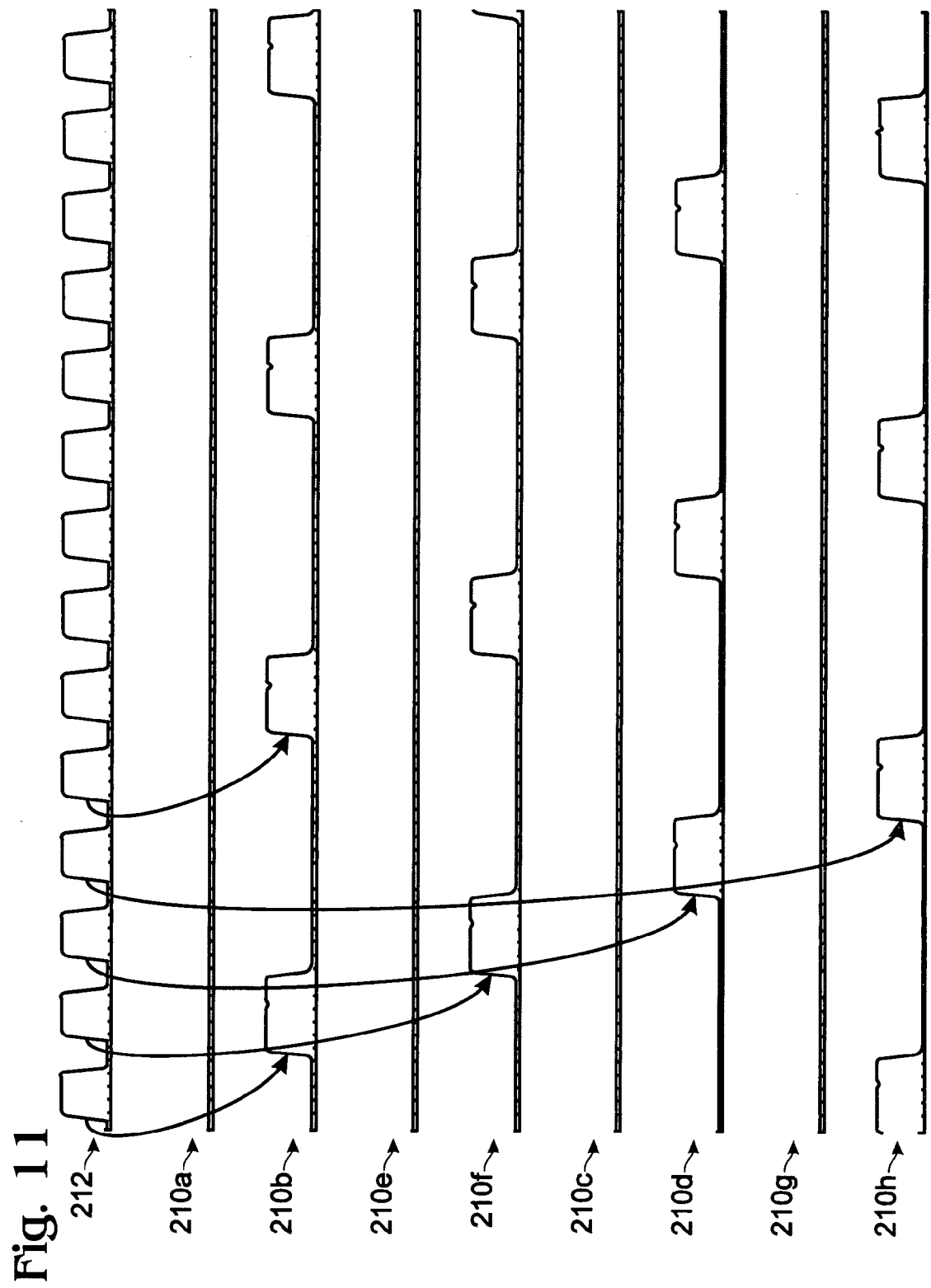
FIG. 11 is a timing diagram depicting the sequence of MUX register outputs that are selected in order to obtain the 1.25 division ratio, with respect to the second frequency.

FIG. 11 is a timing diagram depicting the sequence of MUX register outputs that are selected in order to obtain the 1.25 division ratio, with respect to the second frequency. The daisy-chain register controller has only one pulse high per clock cycle, and shifts to next register output anti-clockwise in the next clock cycle. A phase signal 206 is chosen by a MUX register output pulse that has a 90 degree delay, as compared to the previous selected signal.

Figure 12:
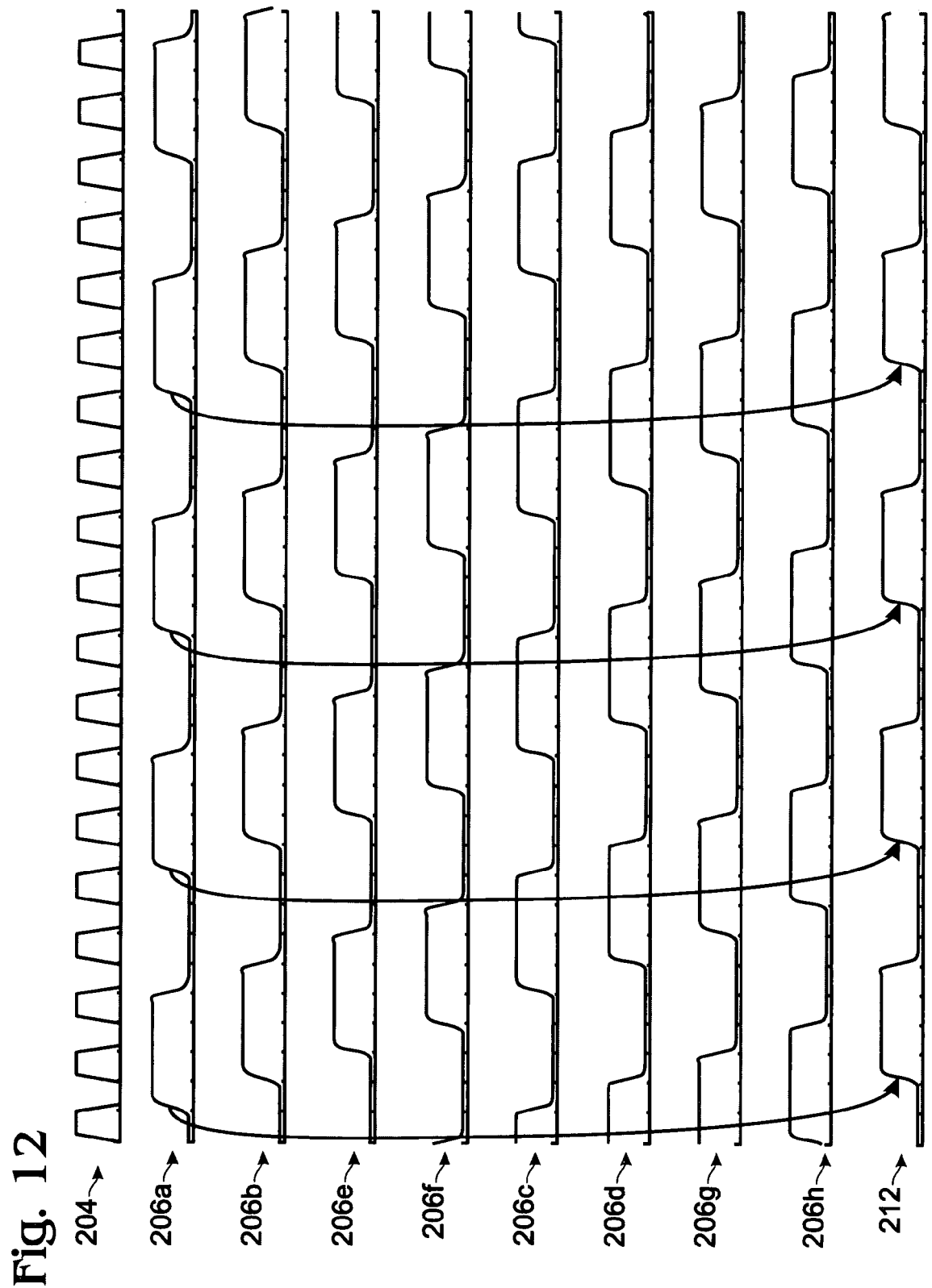
FIG. 12 is a timing diagram depicting the order of second signal phase outputs that must be selected to obtain a division ratio of 4, with respect to the first frequency.

FIG. 12 is a timing diagram depicting the order of second signal phase outputs that must be selected to obtain a division ratio of 4, with respect to the first frequency. Alternately stated, the third signal frequency is equal the second frequency multiplied by 1. As shown, only one of the 8 output phases is selected. The phase selection multiplexer supplies phase outputs having a non-varying (first) period as a third signal with a frequency equal to the second frequency (of the second signal).

FIG. 13 is a timing diagram depicting the sequence of MUX register outputs that are selected in order to obtain the 1 division ratio, with respect to the second frequency. Only one of the 8 phase output signals 206 is selected as output of phase selection MUX. As shown, the daisy-chain register controller generates a first pattern of register output pulses exclusively from a single register (on line 210a, see FIG. 4).

It can be seen from these examples that when the phase selection multiplexer supplies phase outputs having a (second) period different from the first period, that the third signal frequency may be a non-integer quotient of the second frequency. Alternately stated, the third signal frequency may be a non-integer or odd-integer quotient of the first frequency.

In summary, the divider module 202 described above supplies eight second signal outputs, where each output is offset from an adjoining output by 45°. In this example, the phase selection multiplexer creates a third signal with a frequency equal to the second frequency multiplied by one of the following numbers: 0.75, 0.875, 1, 1.125, or 1.25. If the divider module 202 supplies a second signal with a frequency equal to the first frequency divided by four, as described above, the phase selection multiplexer creates a third signal with a frequency equal to the first frequency divided by one of the following numbers: 3, 3.5, 4, 4.5, or 5.

It should be noted that the above-mentioned system permits quotients to be selected with almost no delay, to enable pulse-swallowing with a minimum of glitches and spurious noise. It should also be understood that although an 8 phase/8 register system has been described as an illustration, the system is not limited to any particular number of phases/registers.

Functional Description

Figure 14:
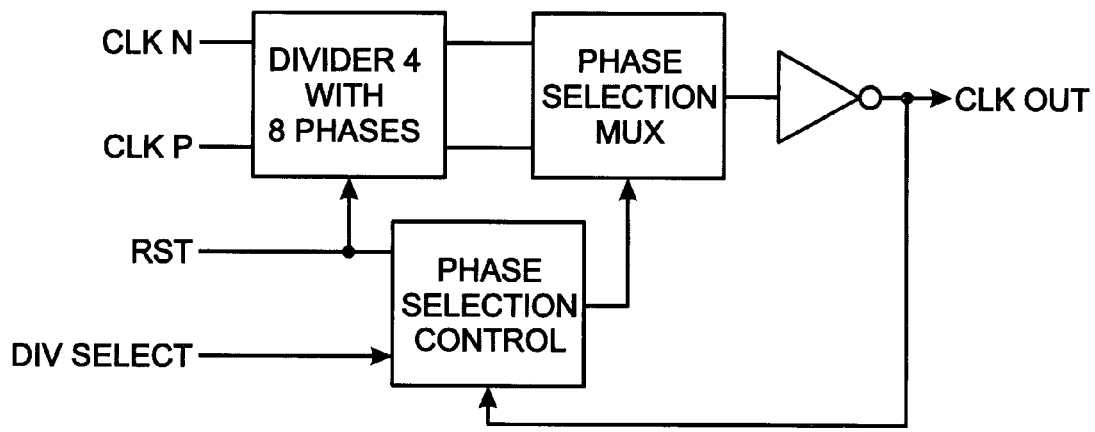
FIG. 14 is a schematic block diagram illustrating the system of FIG. 2 from another perspective.

FIG. 14 is a schematic block diagram illustrating the system of FIG. 2 from another perspective. The system may be modified to function as a triple-modulus system that performs high speed VCO clock division. In this example, the division ratios are 3, 3.5, or 4, as referenced to the input signal. The ratio selection is controlled by 3 input bits, which are used to select the registers in the daisy-chain register controller. In this aspect, the system includes three major blocks: an 8 phase generator (8 PG), a phase selection MUX (PSM), and phase selection control (PSC). The 8 phases are generated by a divide-by-4 divider, generating 45 degree phase differences. The phase selection MUX passes a selected phase output. The phase selection control determines which phase is selected and used as the MUX output.

By choosing the same phase, as statically controlled by the PSC, a division by 4 is obtained at the output of PSM. By advancing the selection of phases by 45 degree, one-half of an input clock cycle is swallowed, creating a PSM output clock with a divider ratio of 3.5. By advancing the selection of phase by 90 degrees, one input clock cycle is swallowed, creating a PSM output clock with a divider ratio of 3.

Figure 15:
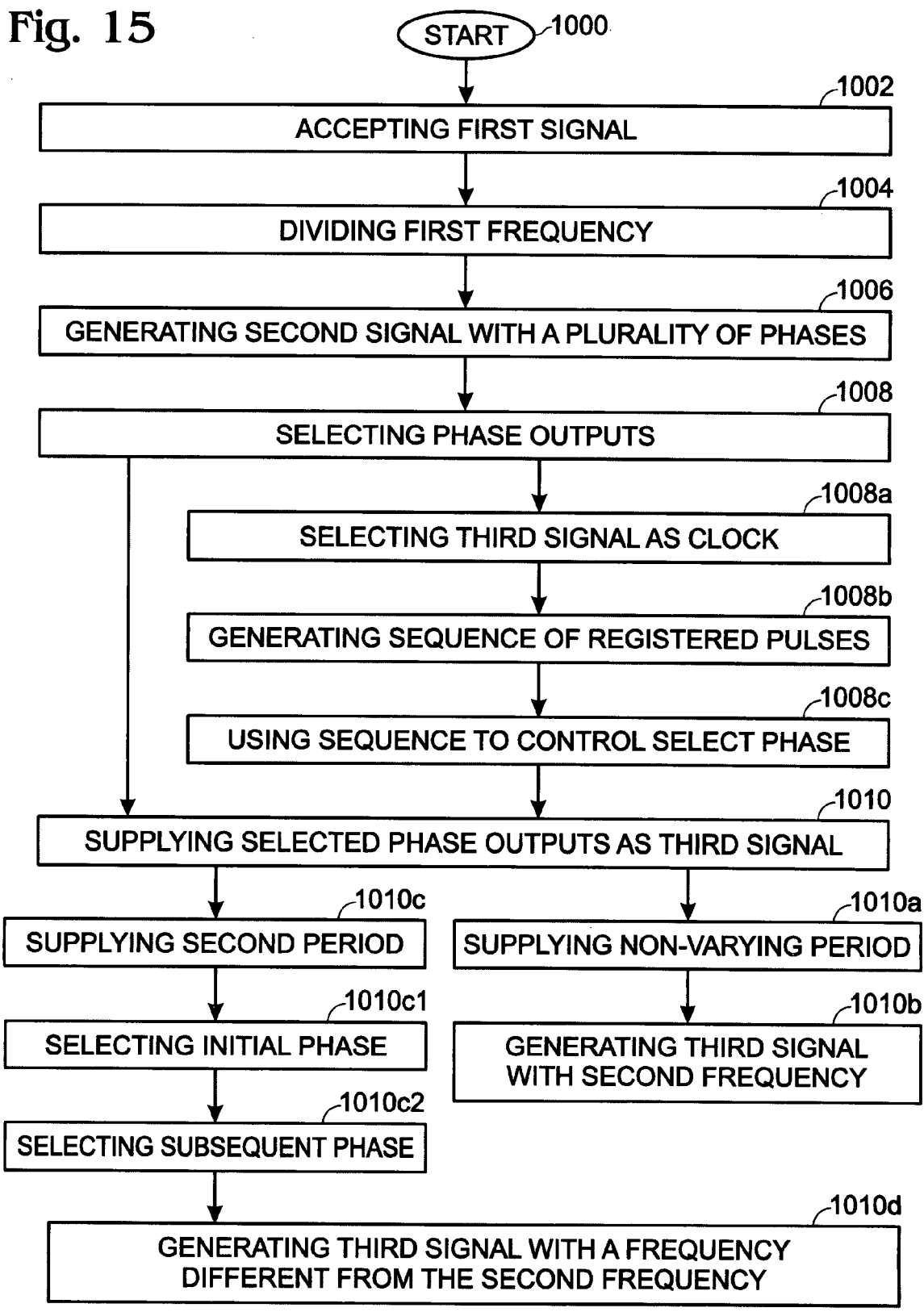
FIG. 15 is a flowchart illustrating a method for multi-modulus division.

FIG. 15 is a flowchart illustrating a method for multi-modulus division. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 accepts an input first signal having a first frequency. Step 1004 divides the first frequency by an integral number. In the examples presented above, the integer value is 4. Step 1006 generates a second signal with a plurality of phase outputs, each having a second frequency. Using a daisy-chain register controller, Step 1008 selects phase outputs. Step 1010 supplies the selected phase outputs as a third signal with a frequency.

In one aspect, generating the second signal in Step 1006 includes generating a second signal with a first number of equally-spaced phase outputs. In the examples presented above, eight second signal outputs are generated, each output offset from an adjoining output by 45°. Then, selecting phase outputs in Step 1008 includes using the daisy-chain register controller as follows. Step 1008a supplies the third signal as a clock signal to registers having outputs connected in a daisy-chain. Step 1008b generates a sequence of register output pulses in response to the clock signals. Step 1008c uses the generated register output pulses to select second signal phase outputs.

In another aspect, generating a sequence of register output pulses (Step 1008b) includes selecting a first pattern of register output pulses generated exclusively from a single register (see FIG. 13). Then, supplying the selected phase outputs as the third signal in Step 1010 includes substeps. Step 1010a supplies phase output pulses having a non-varying first period. Step 1010b generates a third signal having a frequency equal to the second frequency.

In another variation, Step 1008b generates a second pattern of register output pulses. Then, supplying the selected phase outputs as the third signal includes the following substeps. Step 1010c supplies phase output pulses having a second period, different from the first period. Step 1010d generates a third signal with a third frequency, different from the second frequency.

For example, if Step 1010c supplies phase output pulses having a second period, greater than the first period, then Step 1010d generates a third signal with a third frequency, lower than the second frequency (FIG. 7). More explicitly, supplying phase output pulses having a second period, greater than the first period, includes the following substeps. Step 1010c1 selects an initial phase output having an initial phase. Step 1010c2 selects a subsequent phase output having a phase greater than the initial phase. Then, generating the third frequency in Step 1010d includes generating the third frequency in response to advancing the phase between initial and subsequent phase outputs.

Alternately, if Step 1010c supplies phase output pulses having a second period, smaller than the first period, then Step 1010d generates a third signal with a third frequency, greater than the second frequency (FIG. 8). More explicitly, supplying phase output pulses having a second period, smaller than the first period, includes the following substeps. Step 1010c1 selects an initial phase output having an initial phase. Step 1010c3 selects a subsequent phase output having a phase less than the initial phase. Then, generating the third frequency in Step 1010d includes generating the third frequency in response to lagging the phase between initial and subsequent phase outputs. In one aspect, generating a third signal with a third frequency, different from the second frequency (Step 1010d) includes generating a third signal third frequency that is a non-integer quotient of the second frequency.

In the case where Step 1006 generates eight second signal outputs, where each output is offset from an adjoining output by 45°, Step 1010 generates a third signal with a frequency equal to the second frequency multiplied by one of the following numbers: 0.75, 0.875, 1, 1.125, or 1.25. If Step 1004 generates a second signal with a frequency equal to the first frequency divided by four, then Step 1010 generates a third signal with a frequency equal to the first frequency divided by one of the following numbers: 3, 3.5, 4, 4.5, or 5.

A system and method for multi-modulus division has been presented. Examples of particular division ratios and phase spacings have been given to illustrate the invention. However, the invention is not limited to just these examples. Other variations and embodiments of the invention will occur to those skilled in the art.

We claim:

1. A method for multi-modulus division, the method comprising:
 accepting an input first signal having a first frequency;
 dividing the first frequency by an integral number;
 generating a second signal with a plurality of a first number of equally-spaced phase outputs, each having a second frequency;
 using a daisy-chain register controller, selecting phase outputs as follows:
  supplying a third signal as a clock signal to registers having outputs connected in a daisy-chain;
  generating a sequence of register output pulses in response to the clock signal by selecting a first pattern of register output pulses generated exclusively from a single register; and,
 using the generated sequence of register output pulses to select the second signal phase outputs; and,
 supplying the selected phase outputs as the third signal as follows:
  supplying phase output pulses having a non-varying first period; and,
  generating the third signal having the second frequency.

2. The method of claim 1 wherein generating the sequence of register output pulses includes selecting a second pattern of register output pulses;
 wherein supplying the selected phase outputs as the third signal includes:
  supplying phase output pulses having a second period, different from the first period; and,
  generating a third signal with a third frequency, different from the second frequency.

3. The method of claim 2 wherein supplying phase output pulses having a second period, different from the first period, includes supplying phase output pulses having a second period, greater than the first period; and,
 wherein generating the third signal includes generating a third signal third frequency, lower than the second frequency.

4. The method of claim 3 wherein supplying phase output pulses having a second period, greater than the first period, includes:
 selecting an initial phase output having an initial phase;
 selecting a subsequent phase output having a phase greater than the initial phase; and,
 wherein generating the third frequency includes generating the third frequency in response to advancing the phase between initial and subsequent phase outputs.

5. The method of claim 2 wherein supplying phase output pulses having a second period, different from the first period, includes supplying phase output pulses having a second period, smaller than the first period; and,
 wherein generating the third signal includes generating a third signal third frequency, greater than the second frequency.

6. The method of claim 5 wherein supplying phase output pulses having a second period, smaller than the first period, includes:
 selecting an initial phase output having an initial phase;
 selecting a subsequent phase output having a phase less than the initial phase; and,
 wherein generating the third frequency includes generating the third frequency in response to lagging the phase between initial and subsequent phase outputs.

7. The method of claim 2 generating a third signal with a third frequency, different from the second frequency, includes generating a third signal third frequency that is a non-integer quotient of the second frequency.

8. The method of claim 1 wherein generating the second signal with the first number of equally-spaced phase outputs includes generating eight second signal outputs, each output offset from an adjoining output by 45°; and,
 wherein generating the third signal includes generating a third signal with a frequency equal to the second frequency multiplied by a number selected from a group consisting of 0.75, 0.875, 1, 1.125, and 1.25.

9. The method of claim 7 wherein generating the second signal includes generating a second signal with a frequency equal to the first frequency divided by four.

10. A system for multi-modulus division, the system comprising:
 a divider module having an input to accept a first signal having a first frequency, the divider module dividing the first frequency by an integral number and supplying a second signal with a plurality of a first number of equally-spaced phase outputs, each having a second frequency;
 a phase selection multiplexer having an input to accept the plurality of second signal phase outputs, and a second input to accept a control signal, and an output to supply a second signal phase selected in response to the control signal;

a daisy-chain register controller including a plurality of registers with daisy-chain-connected outputs, the daisy-chain register controller accepting a third signal as the register clock signal, generating a sequence of register output pulses in response to the clock signal by selecting a first pattern of register output pulses generated exclusively from a single register, and using the generated sequence of register output pulses as the control signal supplied at the second input to the phase selection multiplexer for selecting the second signal phase outputs; and, wherein the phase selection multiplexer supplies the selected phase outputs as the third signal having a non-varying first period and the second frequency.

11. The system of claim 10 wherein the daisy-chain register controller selects a second pattern of register output pulses; and, wherein the phase selection multiplexer supplies phase outputs having a second period, different from the first period, as a third signal with a third frequency, different from the second frequency.

12. The system of claim 11 wherein the phase selection multiplexer supplies phase outputs having a second period, greater than the first period, creating a third signal third frequency, lower than the second frequency.

13. The system of claim 11 wherein the phase selection multiplexer supplies phase outputs having a second period, less than the first period, creating a third signal third frequency, higher than the second frequency.

14. The system of claim 11 wherein the phase selection multiplexer supplies phase outputs having a second period, different from the first period, creating a third signal third frequency that is a non-integer quotient of the second frequency.

15. The system of claim 10 wherein the divider module supplies eight second signal outputs, each output offset from an adjoining output by 45°; and, wherein the phase selection multiplexer creates a third signal with a frequency equal to the second frequency multiplied by a number selected from a group consisting of 0.75, 0.875, 1, 1.125, and 1.25.

16. The system of claim 15 wherein the divider module supplies a second signal with a second frequency equal to the first frequency divided by four.

* * * * *